(12) United States Patent
Kim et al.

(10) Patent No.: US 7,910,872 B2
(45) Date of Patent: Mar. 22, 2011

(54) PHOTOSENSORS INCLUDING PHOTODIODE CONTROL ELECTRODES AND METHODS OF OPERATING SAME

(75) Inventors: Yi-tae Kim, Gyeonggi-do (KR); Jung-chak Ahn, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 239 days.

(21) Appl. No.: 12/132,814

(22) Filed: Jun. 4, 2008

(65) Prior Publication Data
US 2008/0302949 A1   Dec. 11, 2008

(30) Foreign Application Priority Data

Jun. 7, 2007   (KR) .................. 10-2007-0055728

(51) Int. Cl.
*H01L 27/00* (2006.01)
(52) U.S. Cl. .................. 250/208.1; 250/214.1; 257/292; 257/E27.133
(58) Field of Classification Search ............... 250/208.1, 250/214.1; 257/290–292, E27.131–E27.133
See application file for complete search history.

(56) References Cited

U.S. PATENT DOCUMENTS

| | | | |
|---|---|---|---|
| 5,688,715 A | 11/1997 | Sexton et al. | |
| 6,091,280 A | 7/2000 | Hynecek | |
| 6,168,965 B1 | 1/2001 | Malinovich et al. | |
| 6,821,809 B2 | 11/2004 | Abe et al. | |
| 6,952,227 B2 | 10/2005 | Lee | |
| 7,057,219 B2 | 6/2006 | Park et al. | |
| 2005/0006677 A1 * | 1/2005 | Roy ............................. 257/290 |
| 2005/0104148 A1 | 5/2005 | Yamamoto et al. | |
| 2005/0167704 A1 | 8/2005 | Ezaki et al. | |
| 2006/0043519 A1 | 3/2006 | Ezaki | |
| 2006/0068586 A1 | 3/2006 | Pain | |
| 2006/0076590 A1 | 4/2006 | Pain et al. | |
| 2006/0125038 A1 | 6/2006 | Mabuchi | |
| 2006/0197007 A1 | 9/2006 | Iwabuchi et al. | |

* cited by examiner

*Primary Examiner* — Kevin Pyo
(74) *Attorney, Agent, or Firm* — Myers Bigel Sibley & Sajovec, P.A.

(57) ABSTRACT

A sensor includes a substrate, a floating diffusion node in the substrate, a photodiode in the substrate laterally spaced apart from the floating diffusion region and a transfer transistor coupling the photodiode and the floating diffusion region. The sensor further includes a photodiode control electrode disposed on the photodiode and configured to control a carrier distribution of the photodiode responsive to a control signal applied thereto. The photodiode may include a first semiconductor region of a first conductivity type disposed on a second semiconductor region of a second conductivity type, the floating diffusion region may have the second conductivity type and the photodiode control electrode may be disposed on the first semiconductor region. The photodiode may be configured to receive incident light from a side of the substrate opposite the photodiode control electrode. The transfer transistor may include a gate electrode on a channel region in the substrate and the photodiode control electrode and the transfer transistor gate electrode may be separately controllable. In further embodiments, the photodiode control electrode comprises an extension of the transfer transistor gate electrode.

16 Claims, 6 Drawing Sheets

PHOTOSENSORS INCLUDING PHOTODIODE CONTROL ELECTRODES AND METHODS OF OPERATING SAME

CROSS-REFERENCE TO RELATED APPLICATION

This application claims priority under 35 U.S.C. §119 from Korean Patent Application No. 10-2007-0055728, filed Jun. 7, 2007, the disclosure of which is hereby incorporated by reference herein in its entirety.

FIELD OF THE INVENTION

The present invention relates to semiconductor photosensors and methods of operation thereof and, more particularly, to CMOS sensors and methods of operation thereof.

BACKGROUND OF THE INVENTION

CMOS image sensors are used to transform incident light energy into electrical signals, and are widely used in devices such as digital cameras and video recorders. FIG. 1 is a circuit diagram of a typical photocell of a CMOS image sensor. The photocell includes a photodiode PD that generates carriers responsive to incident light Lin. Referring to FIGS. 1 and 2, in an image capture cycle, carriers are transferred from the photodiode PD to a floating diffusion node FDN by a transfer transistor TTr responsive to a signal S_TG applied to a gate TG of the transfer transistor TTr. A potential developed at the floating diffusion node FDN is proportional to the amount of transferred change, and is used to drive the gate of an amplifier transistor FTr to control a current passing through a select transistor STr. A reset transistor RTr is used to reset the floating diffusion node FDN for a succeeding image capture cycle.

FIG. 3 is a cross-sectional view of a conventional CMOS photocell. A photodiode PD includes an n-type region 20 formed in a p-type substrate 10 and a p+-type 30 region formed on the n-type region 20. A transfer transistor 40 that couples the photodiode PD to an n+-type floating diffusion node region FDN in the substrate 10 includes a transfer gate TG overlying a channel region CH_T in the substrate 10. A reset transistor 50 that couples the floating diffusion node region FDN to a reset node region RN in the substrate 10 includes a reset gate RG overlying a channel region CH_R in the substrate 10. Light Lin is incident on the photodiode PD from a front side of the substrate 10 in an area F1 overlying the p+-type region 30. FIG. 4 illustrates a potential profile for the device shown in FIG. 3.

SUMMARY OF THE INVENTION

Some embodiments of the present invention provide a sensor including a substrate, a floating diffusion node in the substrate, a photodiode in the substrate laterally spaced apart from the floating diffusion region and a transfer transistor coupling the photodiode and the floating diffusion region. The sensor further includes a photodiode control electrode disposed on the photodiode and configured to control a carrier distribution of the photodiode responsive to a control signal applied thereto. The photodiode may include a first semiconductor region of a first conductivity type disposed on a second semiconductor region of a second conductivity type, the floating diffusion region may have the second conductivity type and the photodiode control electrode may be disposed on the first semiconductor region. The photodiode may be configured to receive incident light from a side of the substrate opposite the photodiode control electrode. The transfer transistor may include a gate electrode on a channel region in the substrate and the photodiode control electrode and the transfer transistor gate electrode may be separately controllable. In further embodiments, the photodiode control electrode includes an extension of the transfer transistor gate electrode.

Further embodiments provide a sensor including a photodiode including a first semiconductor region having a first conductivity type disposed on a second semiconductor region having a second conductivity type and a transfer transistor having a channel coupled to the second semiconductor region. The sensor also includes a photodiode control electrode disposed on the first semiconductor region opposite the second semiconductor region. The sensor further includes a control circuit coupled to the photodiode control electrode and the transfer transistor and configured to bias the photodiode control electrode to create a majority-carrier concentration region in first semiconductor region near the photodiode control electrode. In some embodiments, the control circuit may be configured to bias the photodiode control electrode to create a majority-carrier concentration region in the first semiconductor region near the photodiode control electrode while causing the transfer transistor to impede charge transfer through the channel of the transfer transistor.

In some embodiments, the control circuit may be further configured to allow charge transfer through the transfer transistor while biasing the photodiode control electrode to increase a potential across the photodiode. For example, the control circuit may be configured to bias the photodiode control electrode and a gate electrode of the transfer transistor with voltages of opposite polarities to allow charge transfer through the transfer transistor while increasing the potential across the photodiode.

In other embodiments, the control circuit may be further configured to allow charge transfer through the transfer transistor while biasing the photodiode control electrode to increase a minority carrier concentration in the first semiconductor region near the photodiode control electrode. For example, the control circuit may be configured to bias the photodiode control electrode and a gate electrode of the transfer transistor to the same voltage.

Still further embodiments of the present invention provide a sensor including a photodiode including a first semiconductor region having a first conductivity type disposed on second semiconductor region having a second conductivity type, a transfer transistor having a channel coupled to the second semiconductor region and a photodiode control electrode disposed on the first semiconductor region opposite the second semiconductor region. The sensor further includes a control circuit electrically coupled to the photodiode control electrode and the transfer transistor and configured to bias the photodiode control electrode to increase a potential across the photodiode while enabling charge transfer through the transfer transistor. The control circuit may be configured to bias the photodiode control electrode and a gate electrode of the transfer transistor with voltages of opposite polarities to allow charge transfer through the transfer transistor while increasing the potential across the photodiode.

In additional embodiments of the present invention, a sensor includes a photodiode including a first semiconductor region having a first conductivity type disposed on second semiconductor region having a second conductivity type, a transfer transistor having a channel coupled to the second semiconductor region, and a photodiode control electrode disposed on the first semiconductor region opposite the second semiconductor region. The sensor further includes a control circuit electrically coupled to the photodiode control electrode and the transfer transistor and configured to enable charge transfer through the transfer transistor while biasing the photodiode control electrode to increase a minority carrier concentration in a portion of the first semiconductor region near the photodiode control electrode. The control circuit may be configured to bias the photodiode control electrode and a gate electrode of the transfer transistor to the same voltage.

Some embodiments of the present invention provide methods of operating a sensor including a photodiode and a transfer transistor having a channel coupled to the photodiode in which a bias is applied to a photodiode control electrode disposed on the photodiode to control a carrier distribution of the photodiode while controlling the transfer transistor to impede and/or allow charge transfer from the photodiode. The photodiode may include a first semiconductor region of a first conductivity type disposed on a second semiconductor region of a second conductivity type, the second semiconductor region coupled to the channel of the transfer transistor. A bias may be applied to the photodiode control electrode to create a majority-carrier concentration in the first semiconductor region near the photodiode control electrode while impeding charge transfer from the second semiconductor region through the transfer transistor. In further method embodiments, a bias may be applied to the photodiode control electrode to increase a potential across the photodiode while enabling charge transfer through the transfer transistor. In still further embodiments, a bias may be applied to the photodiode control electrode to increase a minority carrier concentration in the first semiconductor region near the photodiode control electrode while enabling charge transfer through the transfer transistor.

DETAILED DESCRIPTION OF EMBODIMENTS OF THE INVENTION

Figure 1:
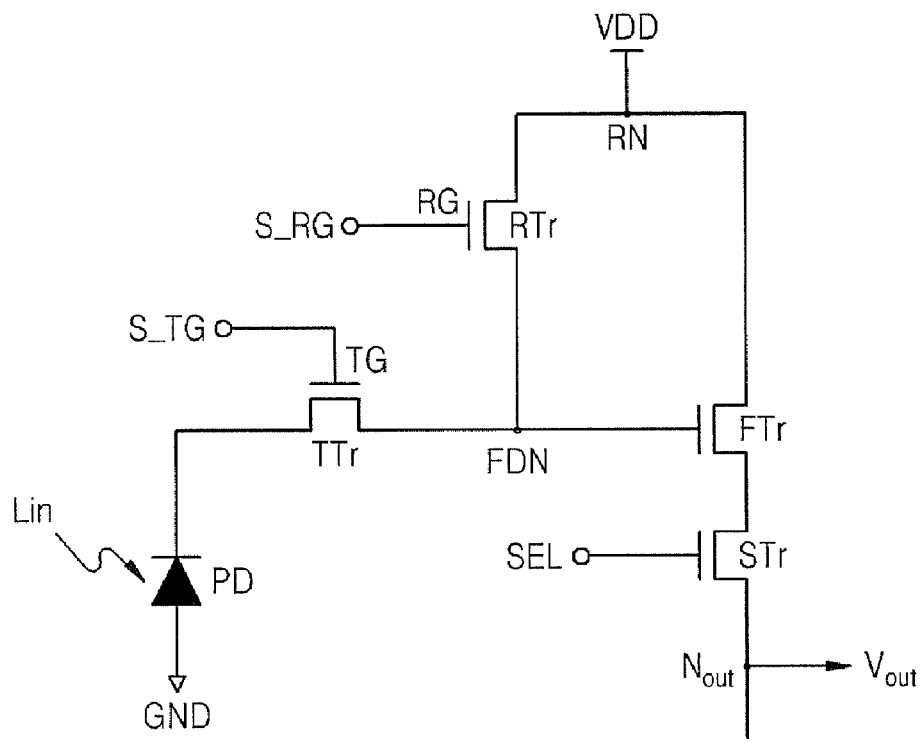
FIG. 1 is a circuit diagram illustrating a conventional CMOS photocell.
Figure 2:
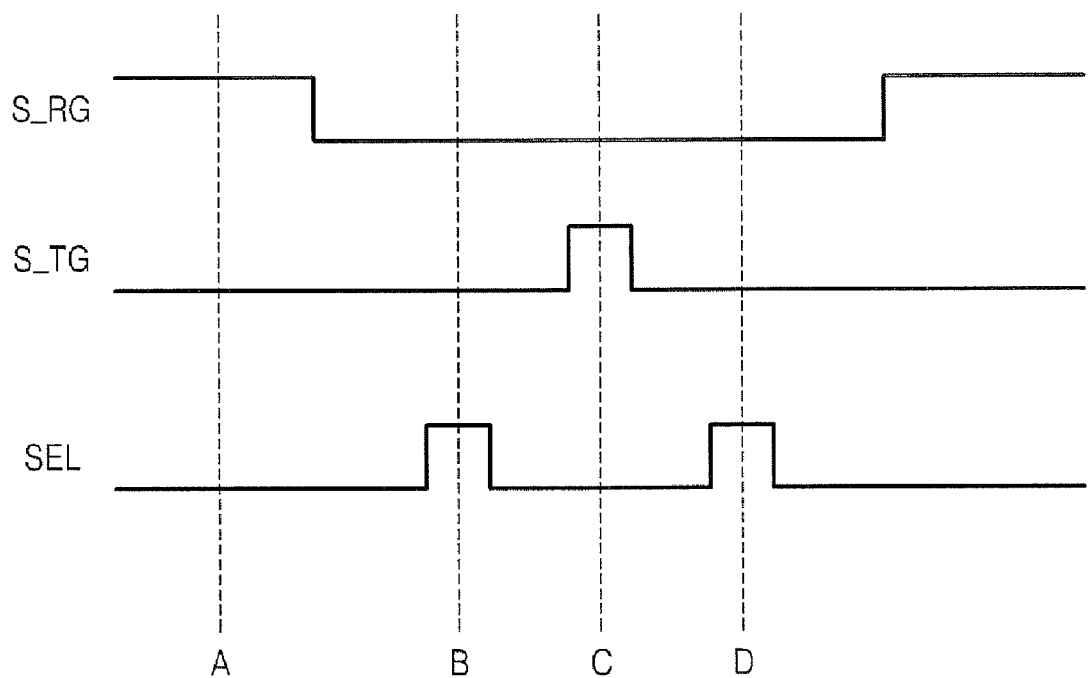
FIG. 2 is a waveform diagram illustrating operations of the conventional CMOS photocell of FIG. 1.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present. As used herein, the term "and/or" includes any and all combinations of one or more of the associated listed items.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "comprise," "comprising," "includes," "including," "have" , "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 5:
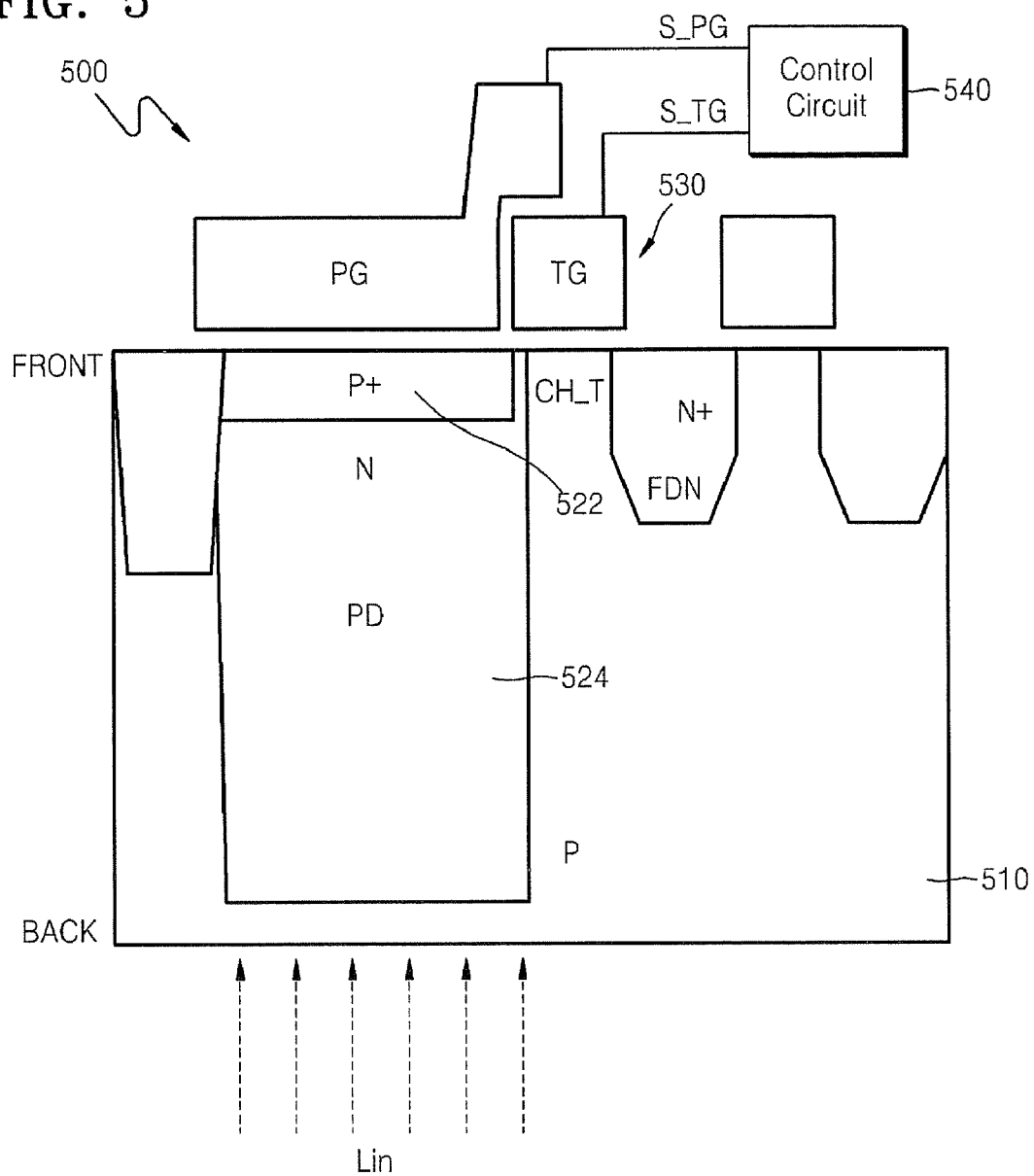
FIG. 5 is a cross-sectional view depicting a CMOS photocell according to some embodiments of the present invention.

FIG. 5 illustrates a CMOS photocell 500 according to some embodiments of the present invention. The photocell 500 includes a photodiode PD formed in a p-type substrate 510. The photodiode PD includes a p-type region 522 disposed on an n-type region 524. A portion of the n-type region 524 of the photodiode PD contacts a channel region CH_T of a transfer transistor 530. The channel region CH_T is controlled by a transfer gate electrode TG disposed thereon on a front side of the substrate 510. The channel region CH_T also contacts a floating node that receives charge from the photodiode PD, here shown as an n-type floating diffusion node FDN disposed in the substrate 510. The photocell 500 further includes a photodiode control electrode PG disposed on the photodiode PD, adjacent the transfer gate electrode TG. The photodiode PD is configured to receive incident light Lin from a backside of the substrate 5 1 0. A control circuit 540 is configured to separately control the photodiode control electrode PG and the transfer gate electrode TG, e.g., to apply voltages S_TG and S_PG thereto. Conceptually illustrated in FIG. 5, it will be understood that the control circuit 540 may be implemented in any of a number of different ways. For example, the control circuit 540 may comprise circuitry located in and/or on the substrate 510 and/or external thereto.

Figure 6:
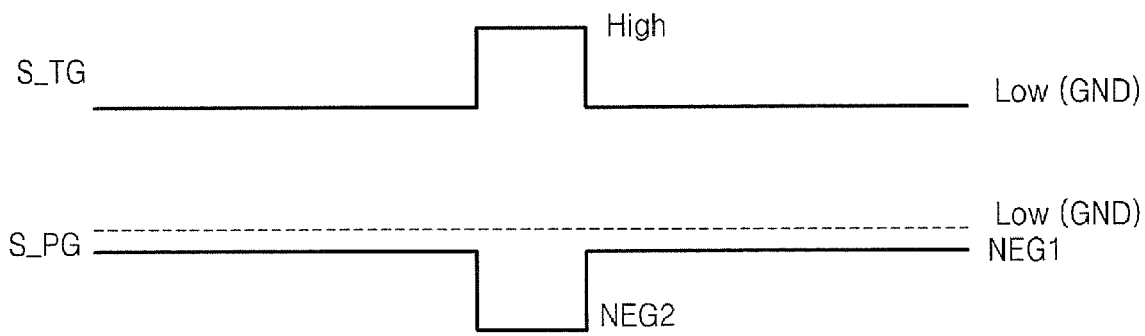
FIG. 6 is a waveform diagram illustrating operations of the CMOS photocell of FIG. 5 according to some embodiments of the present invention.
Figure 7:
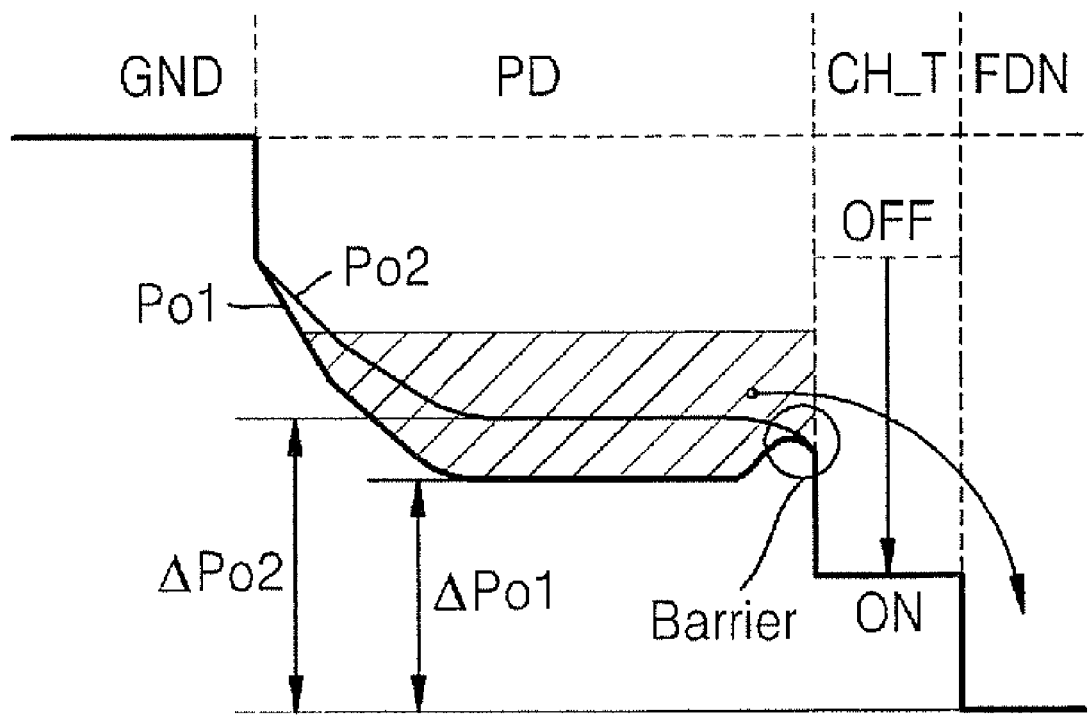
FIG. 7 is a potential diagram illustrating operations of the CMOS photocell of FIG. 5 according to some embodiments of the present invention.

Referring to FIGS. 5-7, use of the photodiode control electrode PG may allow the photocell 500 to provide improved performance over conventional photocells. In particular, as shown in FIG. 6, during a portion of an image capture cycle in which the photodiode is accumulating carriers responsive to the incident light Lin, the control circuit 540 may bias the photodiode control electrode voltage S_PG to a first negative voltage NEG1 below a ground voltage GND while holding the transfer gate electrode voltage S_TG at the ground voltage GND. In this state, the transfer gate electrode TG impedes charge transfer from the photodiode PD to the floating diffusion node FDN through the channel CH_T of the transfer transistor while the negative voltage S_PG on the photodiode control electrode PG causes a majority carrier concentration to form in a portion of the p-type region 522 of the photodiode PD near the photodiode control electrode PG. Formation of this majority-carrier concentration region may help to reduce dark current of the photodiode PD. As further illustrated in FIG. 6, in a subsequent charge transfer phase, the control circuit 540 may drive the transfer gate electrode voltage S_TG to a higher voltage level sufficient to turn on the transfer gate transistor 530 while concurrently driving the photodiode control gate voltage S_G to a more negative voltage NEG2.

Figure 3:
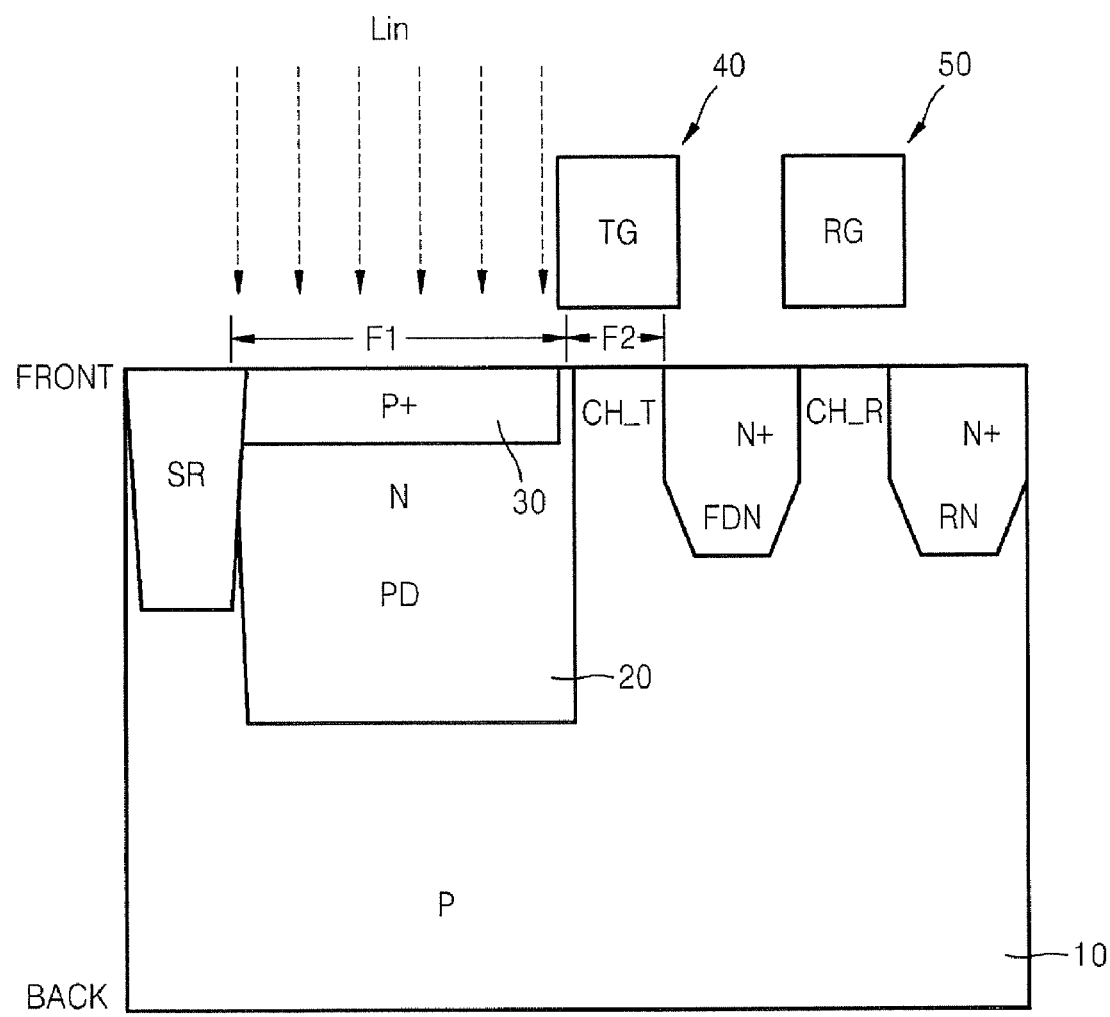
FIG. 3 is a cross-sectional view depicting a conventional CMOS photocell.
Figure 4:
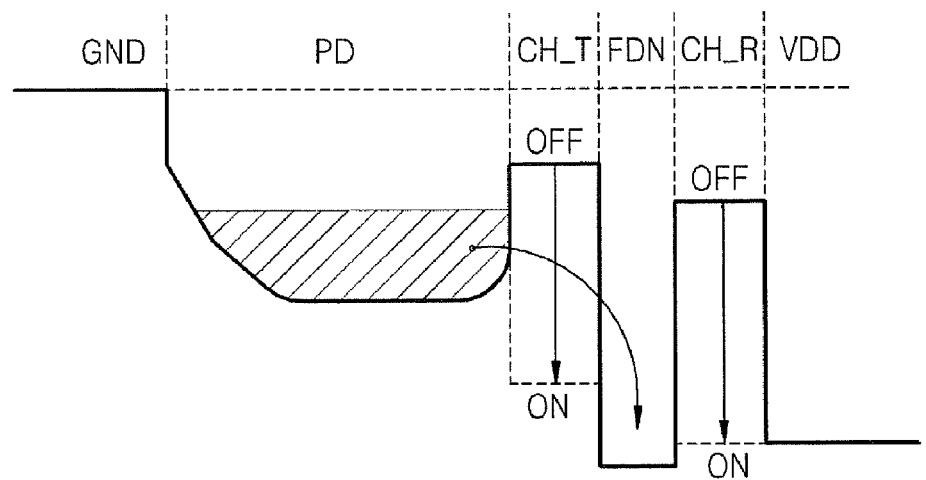
FIG. 4 is a potential diagram illustrating operations of the conventional CMOS photocell of FIG. 3.

Driving the photodiode control electrode PG in this manner during charge transfer may increase the potential of the photodiode PD, as shown in FIG. 7. In particular, FIG. 7 illustrates a potential profile Po1 of a conventional photocell along the lines described above with reference to FIGS. 3 and 4 in comparison with a profile Po2 of a photocell according to FIG. 6 operated along the lines described above. As can be seen, driving the photodiode control electrode PG with a negative voltage as described above may increase the potential Po2 in comparison to the potential Po1, which may help accumulated carriers to overcome a potential barrier that may impede transfer between the photodiode PD and the floating diffusion node FDN.

Figure 8:
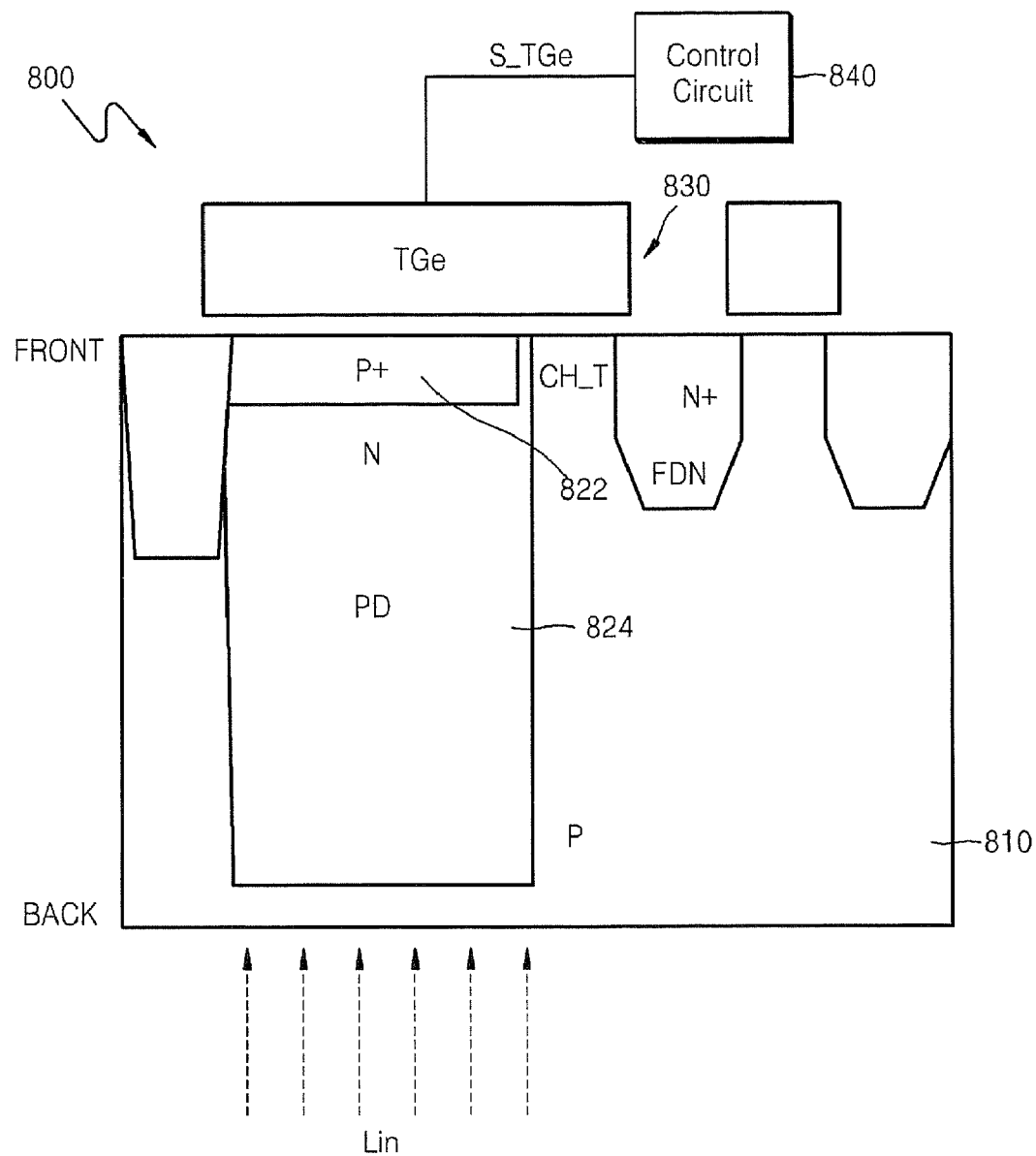
FIG. 8 is a cross-sectional view depicting a CMOS photocell according to further embodiments of the present invention.

According to further embodiments of the present invention, improved dark current suppression and/or charge transfer efficiency may be achieved utilizing a photodiode control electrode that is coupled to the gate electrode of a transfer transistor. FIG. 8 illustrates a CMOS photocell 800 according to some embodiments of the present invention. The photocell 800 includes a photodiode PD formed in a p-type substrate 810. The photodiode PD includes a p-type region 822 disposed on an n-type region 824. A portion of the n-type region 824 contacts a channel region CH_T of a transfer transistor 830. The channel region CH_T also contacts an n-type floating diffusion node FDN disposed in the substrate 810. The photocell 800 further includes an extended electrode TGe that includes a first portion overlying the channel region CH_T that serves as a gate electrode of the transfer transistor 830 and a second portion disposed on the photodiode PD that serves as a photodiode control electrode. The photodiode PD is configured to receive incident light Lin from a backside of the substrate 810. A control circuit 840 is configured to control the extended electrode TGe, e.g., to apply a voltage S_TGe thereto. It will be appreciated that the control circuit 840 may be implemented in a number of different ways, for example, using circuitry located in and/or on the substrate 810 and/or external thereto.

Figure 9:
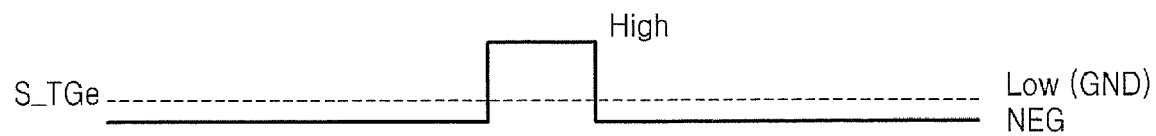
FIG. 9 is a waveform diagram illustrating operations of the CMOS photocell of FIG. 8 according to some embodiments of the present invention.
Figure 10:
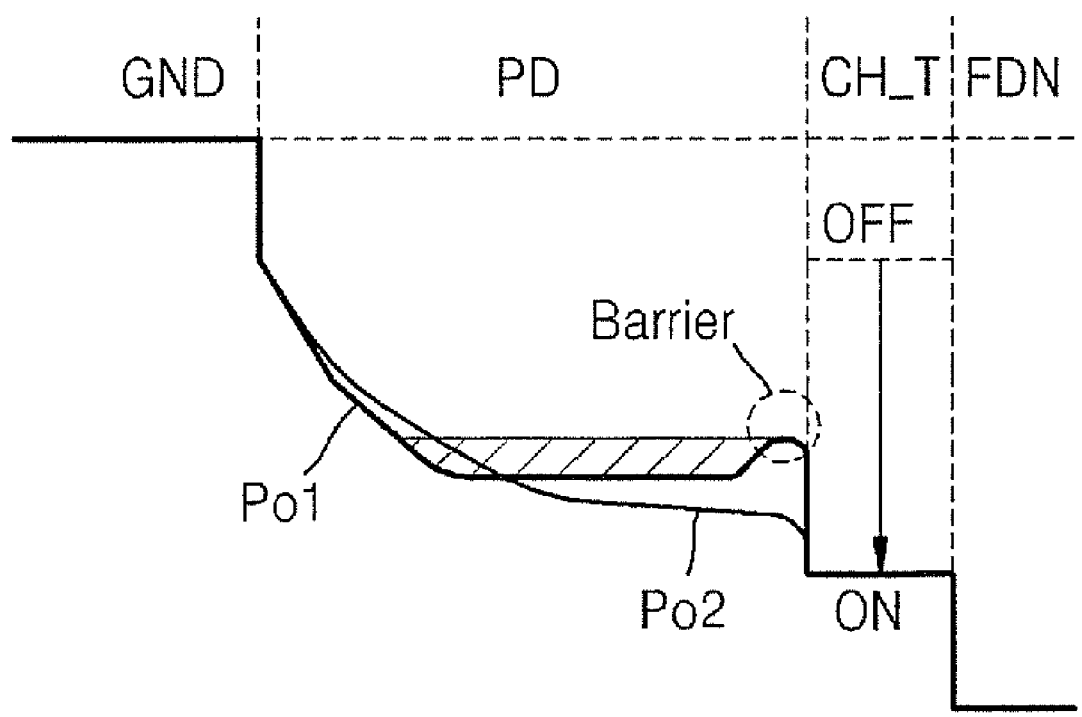
FIG. 10 is a potential diagram illustrating operations of the CMOS photocell of FIG. 8 according to some embodiments of the present invention

Referring to FIGS. 8-10, the extended electrode TGe may allow the photocell 800 to provide improved performance over conventional photocells. In particular, as shown in FIG. 9, during a portion of an image capture cycle in which the photodiode PD is accumulating carriers responsive to the incident light Lin, the control circuit 840 may bias the extended electrode voltage S_TGe to a negative voltage NEG below a ground voltage GND. In this state, charge transfer through the channel CH_T of the transfer transistor 830 is impeded while the negative bias of the portion of the extended electrode TGe overlying the photodiode PD causes a majority carrier concentration region to form in the p-type region 822 of the photodiode PD near the extended electrode TGe. Formation of this majority-carrier concentration region may help to reduce dark current through the photodiode PD.

As further illustrated in FIG. 9, in a subsequent charge transfer phase, the control circuit 840 may drive the extended electrode voltage S_TGe to a higher voltage sufficient to turn on the transfer transistor 830. Driving the extended electrode TGe in this manner during charge transfer may lower a potential barrier near the transfer transistor channel CH_T by increasing a minority carrier concentration in a portion of the p-type region 822 of the photodiode PD near the extended electrode TGe, as shown in FIG. 7. In particular, FIG. 10 illustrates a potential profile Po1 of a conventional photocell along the lines described above with reference to FIGS. 3 and 4 with the channel CH_T of a transfer transistor turned on, in comparison with a profile Po2 of a photocell along the lines of FIG. 8 and 9 as described above. As can be seen, driving the extended electrode with a negative voltage as described above may reduce the potential Po2 with respect to the potential Po1, which may improve efficiency of charge transfer between the photodiode PD and the floating diffusion node FDN.

It will be understood that variations of the structures and operations described above with reference to FIGS. 5-10 fall within the scope of the present invention. For example, while the structures illustrated utilize photodiodes and floating nodes formed using doped regions within a substrate, photocells with similar characteristics may be formed using other structures, e.g., structures that utilize deposited regions instead of diffusion regions formed in a substrate. In other embodiments, a photodiode control electrode structure along the lines illustrated in FIG. 5 may be controlled to provide operations similar to those described above with reference to FIGS. 8-10, e.g., the photodiode control electrode PG and the transfer gate electrode TG may be driven with the same voltages along the lines shown in FIG. 9.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A sensor comprising:
a substrate;
a floating diffusion region in the substrate;
a photodiode in the substrate laterally spaced apart from the floating diffusion region;
a transfer transistor coupling the photodiode and the floating diffusion region; and
a photodiode control electrode disposed on the photodiode and configured to control a carrier distribution of the photodiode responsive to a control signal applied thereto, wherein the photodiode is configured to receive incident light from a side of the substrate opposite the photodiode control electrode.

2. The sensor of claim 1, wherein the photodiode comprises a first semiconductor region of a first conductivity type disposed on a second semiconductor region of a second conductivity type, wherein the floating diffusion region has the second conductivity type and wherein the photodiode control electrode is disposed on the first semiconductor region.

3. The sensor of claim 1, wherein the transfer transistor comprises a gate electrode on a channel region in the substrate and wherein the photodiode control electrode and the transfer transistor gate electrode are separately controllable.

4. The sensor of claim 1, wherein the transfer transistor comprises a gate electrode on a channel region in the substrate and wherein the photodiode control electrode comprises an extension of the transfer transistor gate electrode.

5. The sensor of claim 1, wherein the photodiode is configured to accumulate carriers responsive to the incident light.

6. A sensor comprising:
a photodiode comprising a first semiconductor region having a first conductivity type disposed on a second semiconductor region having a second conductivity type;
a transfer transistor having a channel coupled to the second semiconductor region;
a photodiode control electrode disposed on the first semiconductor region opposite the second semiconductor region; and
a control circuit coupled to the photodiode control electrode and the transfer transistor and configured to bias the photodiode control electrode to a first potential to create a majority-carrier concentration region in the first semiconductor region near the photodiode control electrode while causing the transfer transistor to impede charge transfer through the channel of the transfer transistor in a charge accumulation phase and to bias the photodiode control electrode to a second potential while allowing charge transfer through the transfer transistor in a charge transfer phase.

7. The sensor of claim 6, wherein the the second potential increases a potential of the photodiode with respect to the floating diffusion node.

8. The sensor of claim 6, wherein the control circuit is configured to bias the photodiode control electrode and a gate electrode of the transfer transistor with voltages of opposite polarities to allow charge transfer through the transfer transistor in the charge transfer phase.

9. The sensor of claim 6, wherein the photodiode is configured to receive incident light at a surface of the second semiconductor region opposite the surface of the first semiconductor region.

10. The sensor of claim 9, wherein the photodiode is configured to accumulate carriers responsive to the incident light.

11. A method of operating a sensor comprising a photodiode and a transfer transistor having a channel coupled to the photodiode, wherein the photodiode comprises a first semiconductor region of a first conductivity type disposed on a second semiconductor region of a second conductivity type and wherein the second semiconductor region is coupled to the channel of the transfer transistor, the method comprising
biasing the photodiode control electrode to a first potential to create a majority-carrier concentration region in the first semiconductor region near the photodiode control electrode while causing the transfer transistor to impede charge transfer through the channel of the transfer transistor in a charge accumulation phase; and
biasing the photodiode control electrode to a second potential while allowing charge transfer through the transfer transistor in a charge transfer phase.

12. The method of claim 11, wherein the second potential increases a potential of the photodiode with respect to the floating diffusion node.

13. The method of claim 11, further comprising accumulating carriers in the photodiode responsive to incident light at a surface of the second semiconductor region opposite the surface of the first semiconductor region.

14. A sensor comprising:
a substrate;
a floating diffusion region in the substrate;
a photodiode in the substrate laterally spaced apart from the floating diffusion region;
a transfer transistor coupling the photodiode and the floating diffusion region; and
a photodiode control electrode disposed on and substantially covering the photodiode and configured to control a carrier distribution of the photodiode responsive to a control signal applied thereto, wherein the photodiode is configured to receive incident light from a side of the substrate opposite the photodiode control electrode.

15. The sensor of claim 14, wherein the photodiode is configured to accumulate carriers responsive to the incident light.

16. The method of claim 14, wherein the photodiode control electrode extends to overlap at least a portion of a channel of the transfer transistor.

* * * * *